(12) United States Patent
Oh et al.

(10) Patent No.: US 9,397,254 B2
(45) Date of Patent: Jul. 19, 2016

(54) SUPERLUMINESCENT DIODE AND METHOD FOR IMPLEMENTING THE SAME

(71) Applicant: Electronics and Telecommunications Research Institute, Daejeon (KR)

(72) Inventors: Su Hwan Oh, Daejeon (KR); Min Su Kim, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 14/505,569

(22) Filed: Oct. 3, 2014

(65) Prior Publication Data

US 2015/0115219 A1 Apr. 30, 2015

(30) Foreign Application Priority Data

Oct. 24, 2013 (KR) .................. 10-2013-0126925
May 9, 2014 (KR) .................. 10-2014-0055793

(51) Int. Cl.

| H01L 21/00 | (2006.01) |
| H01L 33/00 | (2010.01) |
| H01L 33/58 | (2010.01) |
| G02B 6/00 | (2006.01) |
| H01S 5/00 | (2006.01) |
| G02B 6/12 | (2006.01) |

(52) U.S. Cl.
CPC .............. *H01L 33/0045* (2013.01); *G02B 6/00* (2013.01); *H01L 33/58* (2013.01); *H01S 5/00* (2013.01); *G02B 6/12004* (2013.01); *H01L 2933/0058* (2013.01)

(58) Field of Classification Search
USPC ................. 257/13, E31.033, E33.008, 14, 257/E33.054, 103, 432, 620, 84, 91, 94, 99; 359/248; 438/31; 372/43.01

See application file for complete search history.

(56) References Cited

U.S. PATENT DOCUMENTS

| 5,585,957 A * | 12/1996 | Nakao .................. B82Y 20/00 257/13 |
| 5,689,358 A * | 11/1997 | Nakao .................. B82Y 20/00 257/13 |
| 7,119,373 B2 * | 10/2006 | Velez .................. H01L 33/0045 257/103 |

(Continued)

FOREIGN PATENT DOCUMENTS

| KR | 10-2009-0039247 A | 4/2009 |
| KR | 10-2009-0065982 A | 6/2009 |
| KR | 10-2012-0008326 A | 1/2012 |

OTHER PUBLICATIONS

Oh et al. "High-Performance 1.55 micrometer SuperLuminescent Diode With Butt-Coupled Spot-Size Converter"; IEEE Photonics Technical Letters, vol. 20, No. 11, Jun. 1, 2008, pp. 894-896.*

(Continued)

*Primary Examiner* — Telly Green
(74) *Attorney, Agent, or Firm* — Rabin & Berdo, P.C.

(57) ABSTRACT

A superluminescent diode and a method for implementing the same, wherein the method includes growing a first epi layer on top of an SI (semi-insulating substrate); re-growing a butt based on the first epi layer; forming a tapered SSC (spot size converter) on the re-grown butt layer; forming an optical waveguide on an active area that is based on the first epi layer and on an SSC area that is based on the tapered SSC; forming an RWG on the optical waveguide; and forming a p-type electrode and an n-type electrode.

14 Claims, 5 Drawing Sheets

(56) References Cited

U.S. PATENT DOCUMENTS

| | | |
|---|---|---|
| 7,688,870 B2 | 3/2010 | Oh et al. |
| 8,107,508 B2 * | 1/2012 | Oh .................... H01S 5/14 |
| | | 372/43.01 |
| 8,548,015 B2 | 10/2013 | Choi |
| 2009/0154514 A1 * | 6/2009 | Oh ................ H01L 33/0045 |
| | | 372/45.011 |

OTHER PUBLICATIONS

Okamoto et al. "Narrow beam 1.3 micrometer superluminescent diode with buttjointed selectiviely grown spot size converter" Electronic Letters, vol. 33, No. 9, Apr. 24, 1997. pp. 811-812.*

* cited by examiner

SUPERLUMINESCENT DIODE AND METHOD FOR IMPLEMENTING THE SAME

CROSS-REFERENCE TO RELATED APPLICATIONS

This application claims the benefit of priority under 35 U.S.C. §119(a) of Korean Patent Application Nos. 10-2013-0126925, filed on Oct. 24, 2013 and 10-2014-0055793, filed on May 9, 2014, in the Korean Intellectual Property Office, the entire disclosure of which is incorporated herein by reference for all purposes.

BACKGROUND

1. Field of Invention

Various embodiments of the present invention relate to optical communication, and more particularly, to a superluminescent diode that is a light source of a wavelength tunable laser and a method for implementing the same.

2. Description of Related Art

In order to implement an economical WDM (wavelength division multiplexing) subscriber network system, it is essential to develop a stable and economical light source. Especially, since in a WDM subscriber network system, communication is made with each subscriber dedicated with a certain wavelength, research is needed on a wavelength-independent light source that is capable of providing a same light source to subscribers regardless of their dedicated wavelengths.

As part of an effort to develop such a colorless light source, a WL FP-LD (wavelength-locked Febry-Perot Laser Diode), RSOA (reflective semiconductor optical amplifier), and PLC (planar lightwave circuit)-ECL (external cavity laser) are actively studied these days.

Of the laser diodes used as light emitting elements in optical communication, an FP-LD (Febry-Perot Laser Diode) is inexpensive and easy to manufacture. However, an FP-LD generates a plurality of longitudinal modes, and thus it is difficult to be applied to long-distance transmission and WDM transmission. As an alternative to an FP-LD, there is a DFB-LD (Distributed Feed Back-Laser Diode) that has a narrow line width and generates single mode characteristics with stability, but a DFB-LD is expensive and difficult to manufacture.

Thus, as an alternative, various types of external cavity lasers were proposed. Such an external cavity laser is characterized to resonate in a single mode where longitudinal modes of an FP-LD overlap a mode of an external cavity, and to have excellent wavelength selectivity and temperature stability. However, most external cavity laser structures use an optical bragg lattice, and is thus either complicated or requires high precision to manufacture, making it difficult to be applied to low cost commercial products.

SUMMARY

Various embodiments of the present invention are directed to a method for implementing an SLD (superluminescent diode) that is a light source of a wavelength tunable laser.

Furthermore, various embodiments of the present invention are directed to an SLD (superluminescent diode) that is a light source of a wavelength tunable laser.

One embodiment of the present invention provides a method for implementing an SLD (superluminescent diode) that is a light source of a wavelength tunable laser, the method including growing a first epi layer on top of an SI (semi-insulating substrate); re-growing a butt based on the first epi layer; forming a tapered SSC (spot size converter) on the re-grown butt layer; forming an optical waveguide on an active area that is based on the first epi layer and on an SSC area that is based on the tapered SSC; forming an RWG (ridge waveguide) on the optical waveguide; and forming a p-type electrode and an n-type electrode.

In the embodiment, the first epi layer may be formed by successively laminating an n-InP buffer layer, InGaAsP passive waveguide layer, n-InP lower clad layer, multiple quantum well active layer and p-InP cap clad layer.

In the embodiment, the re-growing a butt based on the first epi layer may include laminating an SiNx thin film on top of the p-InP cap clad layer; etching the SiNx thin film, the p-InP cap clad layer and the multiple quantum well active layer; forming an InGaAsP waveguide layer on the etched area; and forming an p-InP layer on the InGaAsP waveguide layer.

In the embodiment, the forming a tapered SSC on the re-grown butt layer may include etching a portion of the InGaAsP waveguide layer and the p-InP layer; and forming the tapered SSC on top of the p-InP layer.

In the embodiment, the forming an optical waveguide based on the first epi layer and the SSC may include etching a portion of the active area and the SSC area including the unetched SiNx thin film layer, the p-InP cap clad layer, and the multiple quantum well active layer until the n-InP butter layer.

In the embodiment, the forming an RWG on the optical waveguide may include laminating a current blocking layer on a right and left of the optical waveguide; laminating a clad layer on top of the optical waveguide and the current blocking layer; laminating an ohmic layer on top of the clad layer; and selectively etching the current blocking layer, the clad layer and the ohmic layer.

In the embodiment, the active area and the SSC area may be implemented in a PBH (planar buried heterostructure) structure.

In the embodiment, the SSC area may be implemented to curve by 3 to 15 degrees.

In the embodiment, the RWG may be implemented to have a width of 9 to 11 μm.

In the embodiment, the method may further include implementing a p-type electrode of a phase control area that is an additional electrode on the SSC area in order to adjust a reflective index of an optical signal.

Another embodiment of the present invention provides an SLD (superluminescent diode) that is a light source of a wavelength tunable laser, the SLD including a first epi layer formed on top of an SI (semi-insulating) substrate; a butt layer grown based on at least a portion of the first epi layer; a tapered SSC (spot size converter) formed on the butt layer; an optical waveguide formed on an active area that is based on the first epi layer and on an SSC area that is based on the tapered SSC; an RWG (ridge waveguide) formed on the optical waveguide; a type electrode formed on an upper portion of the RWG; and an n-type electrode formed on a side portion of the RWG area.

In the embodiment, the first epi layer may include an n-InP buffer layer, InGaAsP passive waveguide layer, n-InP lower clad layer, multiple quantum well active layer and p-InP cap clad layer successively laminated on top of the SI substrate.

In the embodiment, the butt layer may be formed on an area where the p-InP cap clad layer and the multiple quantum well active layer are etched, and the butt layer may include an InGaAsP waveguide layer formed on an n-InP lower clad layer of the etched area; and a p-InP layer formed on the InGaAsP waveguide layer.

In the embodiment, the RWG may include a current blocking layer formed on a right and left of the optical waveguide; a clad layer formed on top of the optical waveguide and the current blocking layer; and an ohmic layer formed on the clad layer.

In the embodiment, the RWG may have a width of 9 to 11 μm.

In the embodiment, the SLD may include on the SSC area a p-type electrode of a phase control area, that is an additional electrode for adjusting a reflective index of an optical signal.

As aforementioned, when using a method for implementing a superluminescent diode according to an embodiment of the present invention, it is possible to implement a wavelength tunable external cavity laser having excellent optical power characteristics and operable at or above 10 Gbps by manufacturing a PLC-ECL that uses a PBH-SLD structure operable at or above 10 Gbps as a light source.

BRIEF DESCRIPTION OF THE DRAWINGS

The above and other features and advantages of the present invention will become more apparent to those of ordinary skill in the art by describing in detail embodiments with reference to the attached drawings in which.

DETAILED DESCRIPTION

Figure 1:
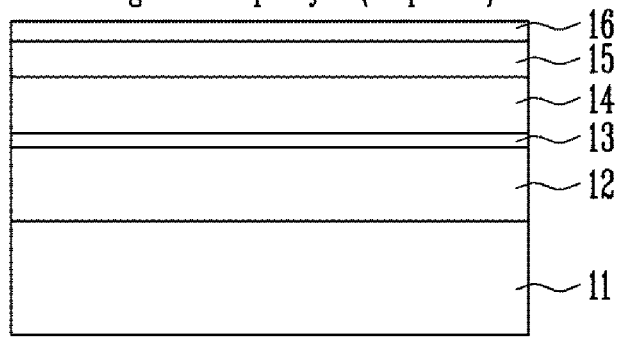
FIGS. 1 and 2 are conceptual views illustrating a method for manufacturing an SLD according to an embodiment of the present invention.
Figure 1:
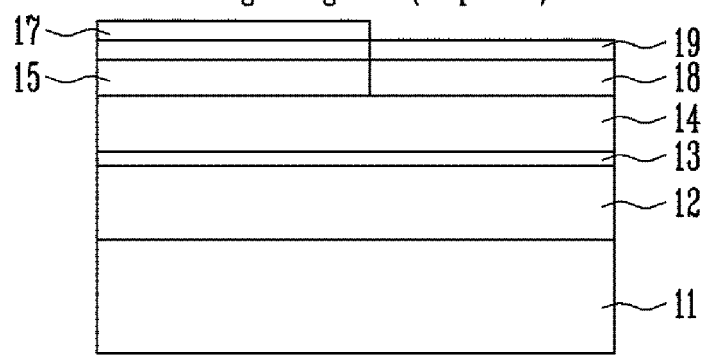
Figure 1:
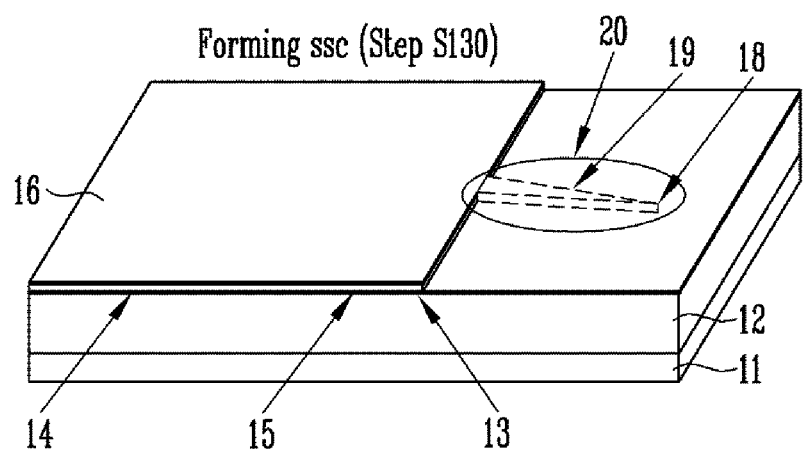

The present invention will be described more fully hereinafter with reference to the accompanying drawings, in which embodiments of the invention are shown. This invention may, however, be embodied in different forms and should not be construed as limited to the embodiments set forth herein.

Rather, these embodiments are provided so that this disclosure will be thorough and complete, and will fully convey the scope of the present invention to those skilled in the art. In the drawings, a thicknesses and a distance of components are exaggerated compared to an actual physical thickness and interval for convenience of illustration. In the following description, detailed explanation of known related functions and constitutions may be omitted to avoid unnecessarily obscuring the subject manner of the present invention. Like reference numerals refer to like elements throughout the specification and drawings.

'a first/a second' may be used in describing various components, but it should not be interpreted that the components are limited by 'a first/a second'. These terms are used only for the purpose of differentiating one component from other components. For example, a first component may be mentioned as a second component without departing from the scope of the present invention. Likewise, a second component may be mentioned as a first component. 'And/or' represents a combination of a plurality of relevant items disclosed or any one of plurality of relevant items disclosed.

Furthermore, 'connected/accessed' represents that one component is directly connected/accessed to another component or indirectly accessed through another component. In this specification, a singular form may include a plural form as long as it is not specifically mentioned in a sentence. Furthermore, 'include/comprise' or 'including/comprising' used in the specification represents that one or more components, steps, operations, and elements exist or are added.

It should be readily understood that the meaning of "on top of" in the present disclosure should be interpreted in the broadest manner so that "on top of" means not only "directly on top of" but also "on top of" something with an intermediate feature(s) or a layer(s) or a film(s) therebetween, and that "below" means not only directly below but also below something with an intermediate feature(s) or a layer(s) or a film(s) therebetween.

As part of an effort to develop a colorless light source, a WL FP-LD (wavelength-locked Febry-Perot Laser Diode), RSOA (reflective semiconductor optical amplifier), and PLC (planar lightwave circuit)-ECL (external cavity laser) are actively studied these days.

Of the aforementioned, a re-modulation structure that uses an RSOA is disadvantageous in that not only is it influenced by the characteristics of a light source being injected but also in that the data rate that may be directly modulated is limited to 1.25 Gbps. In this regard, as a light source of an ultimate WDM optical subscriber network, a PLC-ECL that may be directly modulated at or above 2.5 Gbps is widely used. Such a PLC-ECL may have a structure where grating are formed on a silica and polymer waveguide formed on a silicon substrate and where a semiconductor laser that is a light source is hybrid integrated.

A semiconductor laser that is a light source of a PLC-ECL should not resonate such that a reflectance of an exit surface is not more than 0.1%, and should be an element having a high power at low current operations. Therefore, light sources that satisfy these conditions may include an FP-LD or SLD (superluminescent diode). Of these, SLDs that have generally large bandwidths is mainly used as a light source of a PLC-ECL.

A general SLD is manufactured such that an active layer of optical waveguide is tilted by 3~15 degrees, in order to reduce the reflectance of its exit cross-section. When the active layer or optical waveguide is tilted by 3~15 degrees, the reflectance of the exit cross-section may decrease but a critical current or operational current may increase, and thus it may not be suitable as a light source for WDM-PON. Hence, researches are being made to develop an SLD that may become a light source having characteristics of an FP-LD coated to be non-reflective and highly reflective, in order to overcome such incompatibility.

In an embodiment of the present invention, an SLD with improved performance and a PLC-ECL implemented using the improved SLD are disclosed. Hereinbelow, a method for implementing an SLD (superluminescent diode) that is combined with a PLC based external cavity is disclosed. A wavelength tunable laser of an embodiment of the present invention may have an operating speed of or above 10 Gbps using an SLD implemented to be operable at or above 10 Gbps.

Hereinbelow, for convenience of explanation, an SLD according to an embodiment of the present invention is described based on an assumption that the SLD uses a structure having excellent FFP (far field pattern) characteristics and using an Si—InP substrate operable at a low current. However, the SLD according to the embodiment of the present invention may be implemented to have a structure that uses an Si—InP substrate but may also be implemented to have a structure that uses an RWG structure or an Fe-doped current blocking layer.

Figure 2:
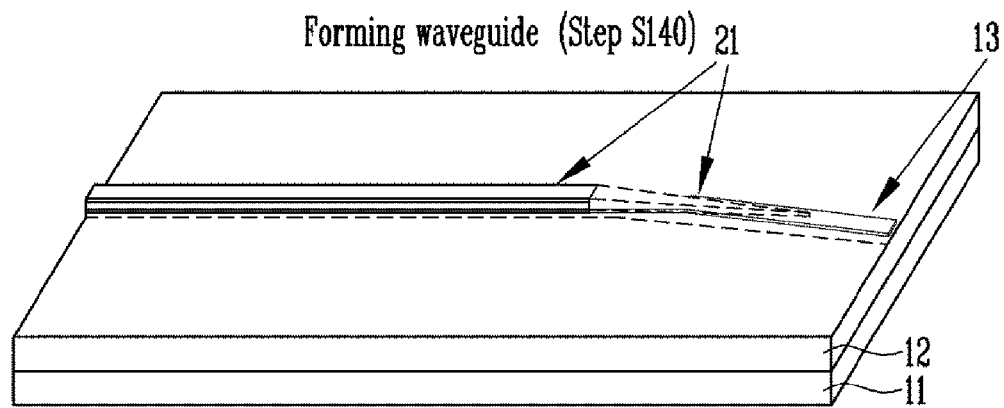
Figure 2:
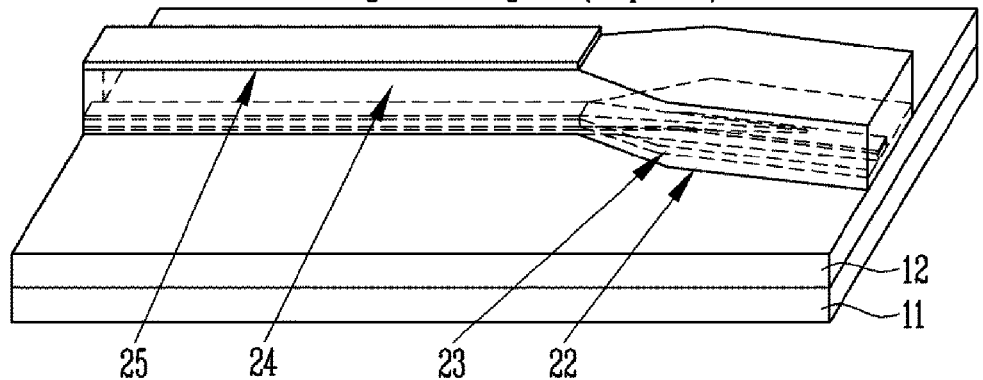
Figure 2:
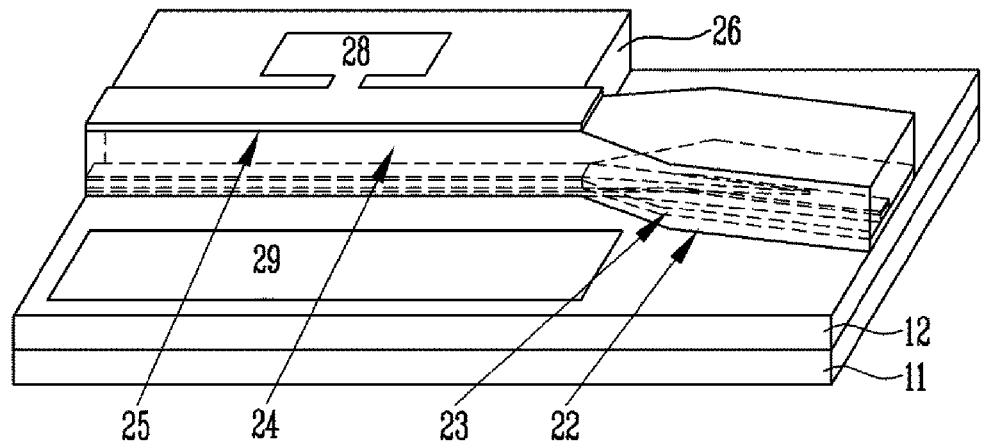

FIGS. 1 and 2 are conceptual views illustrating a method for manufacturing an SLD according to an embodiment of the present invention.

Referring to FIG. 1, a first epi layer is grown (step S110).

In order to manufacture an SLD, a first epi layer may be formed by successively laminating an n-InP buffer layer 12, InGaAsP passive waveguide layer 13, n-InP lower clad layer 14, multiple quantum well active layer 15 and p-InP cap clad layer 16.

A butt layer is re-grown (step S120).

At step S120, a butt layer may be re-grown. First of all, an SiNx thin film 17 may be laminated on top of the p-InP cap clad layer 16. Besides the SiNx thin film 17 located on a portion of the laminated SiNx thin film, the SiNx thin film laminated on a remaining area may be etched. An unetched portion may be an active layer that will be explained hereinbelow, and the portion that may be etched may be an SSC area that will be explained hereinbelow.

Furthermore, the p-InP layer 16 and the multiple quantum well active layer 15 below the etched SiNx thin film may be additionally etched. After etching a portion of the SiNx thin film 17, p-InP layer 16, and multiple quantum well active layer 15 as aforementioned, an InGaAsP waveguide layer 18 and a p-InP layer 19 may be grown on top of the etched area. The InGaAsP waveguide layer 18 and the p-InP layer 19 may be expressed as a butt re-growth layer.

An SSC (spot size converter) is formed (step S130).

At step S130, on the butt re-growth layer disclosed at step S120, an SSC 20 may be formed. The butt re-growth layer may be etched so as to form the SSC area. A portion of the n-InP bottom clad layer 14, InGaAsP waveguide layer 18 and p-InP layer 19 may be etched so that the SSC may be formed. The SSC 20 may be formed to be tapered by or below a range of 1.5 μm to 0.2 μm.

Referring to FIG. 2, an optical waveguide is formed (step S140).

At step S140, in order to form an optical waveguide layer 21 on the active area and the SSC area, a portion besides the optical waveguide layer may be selectively etched. The active area may be the unetched portion of the SiNx thin film 17, p-InP layer 16, and multiple quantum well active layer 15 of step S120. The SSC area may be an area where the SSC is formed. After forming the optical waveguide layer 12, in order to increase the coupling efficiency of a light that is waveguided, the passive waveguide layer 13 is etched in a selective etching method. The width of the passive waveguide layer may be 2~9 μm. The FFP (far field pattern) may differ depending on the width of the passive waveguide layer 13. The width of the passive waveguide layer 13 may differ depending on the shape of the SLD.

The optical waveguide may be formed on the active area and the SSC area. The optical waveguide may be formed to have a width of for example 1~1.5 μm. The optical waveguide located on the active area may be differentiated as an active area optical waveguide, while the optical waveguide located on the SSC area is differentiated as an SSC area waveguide.

After laminating a current blocking layer, a clad layer and an ohmic layer are successively laminated, and then an RWG is formed (step S150).

On top of the optical waveguide formed at step S140, current blocking layers a p-InP current blocking layer 22 and an n-InP current blocking layer 23 may be formed. Then, a p-InP clad layer 24 and a p+-InGaAs ohmic layer 52 mat be grown, which may then be etched in order to implement an RWG as in step S150.

A polyimide is formed, and then a p-electrode and an n-electrode are formed (step S160).

After a polyimide 26 is laminated on one side of the RWG of the active area, an SiNx 27 thin film may be formed on top of the polyimide 26. On top of the ohmic layer 25, a p-electrode 28 may be formed. Furthermore, on top of the n-InP buffer layer 12 located next to the RWG, an n-electrode 29 may be formed.

Through a process of step S110 to step S160, an SLD having an operating speed of or above 10 Gbps may be manufactured.

To briefly explain the aforementioned steps, an SLD of a wavelength tunable laser may be implemented through a step of growing a first epi layer on top of an SI (semi-insulating) substrate, a step of re-growing a butt based on the first epi layer and forming a tapered SSC (spot size converter), a step of forming an optical waveguide and an RWG on an active area that is based on the first epi layer and on an SSC area that is based on the tapered SSC, and a step of forming a p-type electrode and an n-type electrode.

At the aforementioned steps, the first epi layer may be formed by successively laminating an n-InP buffer layer, InGaAsP passive waveguide layer, n-InP lower clad layer, multiple quantum well active layer, and p-InP cap clad layer. The step of regrowing a butt based on the first epi layer and forming a tapered SSC (spot size converter) may include a step of laminating an SiNx thin film on top of the p-InP cap clad layer and etching the SiNx thin film, p-InP cap clad layer and multiple quantum well active layer and then growing an InGaAsP waveguide layer and p-InP layer on the etched area; and a step of etching a portion of the InGaAsP waveguide layer and p-InP layer and then forming a tapered SSC on top of the p-InP layer. Furthermore, the step of forming an optical waveguide and RWG based on the first epi layer and SSC may include a step of etching a portion of the active area and SSC area where the SiNx thin film, p-InP cap clad layer, multiple quantum well active layer are not etched until the n-InP buffer layer to form an optical waveguide, and a step of laminating a current blocking layer, clad layer and ohmic layer on top of the optical waveguide and forming the RWG.

Hereinbelow, an SLD manufactured based on the method disclosed in FIGS. 1 and 2 is disclosed in detail with reference to FIGS. 3 to 5.

Figure 3:
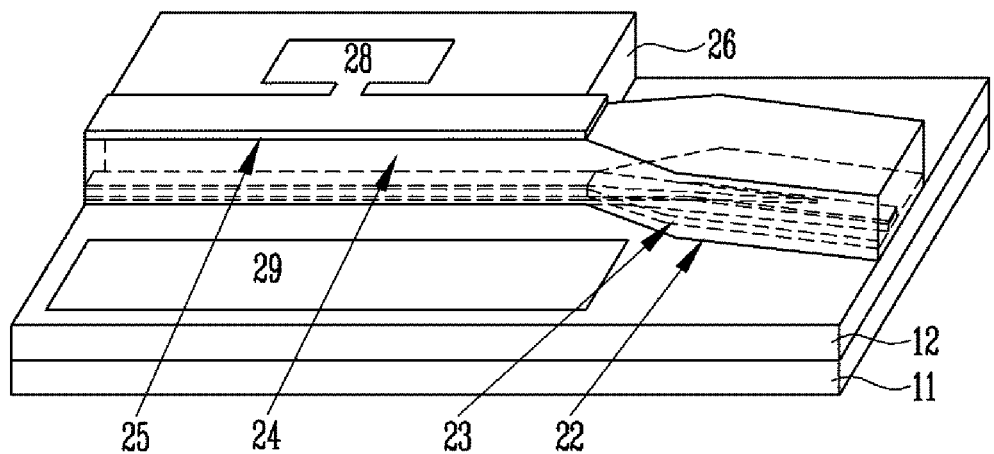
FIG. 3 is a conceptual view illustrating an SLD according to an embodiment of the present invention.

FIG. 3 is a conceptual view illustrating an SLD according to an embodiment of the present invention.

Referring to FIG. 3, an SLD according to an embodiment of the present invention may use an SI (semi-insulating) substrate 11 as a substrate. Furthermore, an active area and SSC area of the SLD may be implemented to have a PBH (planar buried heterostructure) structure. The active area may indicate an area where a multiple quantum well active layer exists. The SSC area may indicate an area implemented by single integrating an SSC. The SSC may be implemented by growing an InGaAsP waveguide layer and p-InP layer as aforementioned. The active area and SSC area may implement an optical waveguide. The optical waveguide located on the active area may be differentiated as an active area optical waveguide, while the optical waveguide located on the SSC area may be differentiated as an SSC area waveguide.

After laminating a current blocking layer 22, 23 on a right and left of the optical waveguide, and a clad layer 24 and ohmic layer 25 on top of the optical waveguide, an RWG including the active area and SSC area may be formed to have a width of about 10 μm.

The RWG may be implemented by etching an area besides the area used as the optical waveguide in order to reduce the parasitic capacitance. Furthermore, a polyimide 26 may be formed on one area of the RWG in order to form an electrode, and an SiNx layer 27 and p-electrode 28 may be formed on top of the polyimide. Furthermore, an n-electrode 29 may be formed on top of the n-InP buffer layer 12 etched in order to generate the electrode. Furthermore, the RWG on the SSC area may be implemented to have a structure tilted by 3~15 degrees in order to reduce the reflectance on the exit interface.

Figure 4:
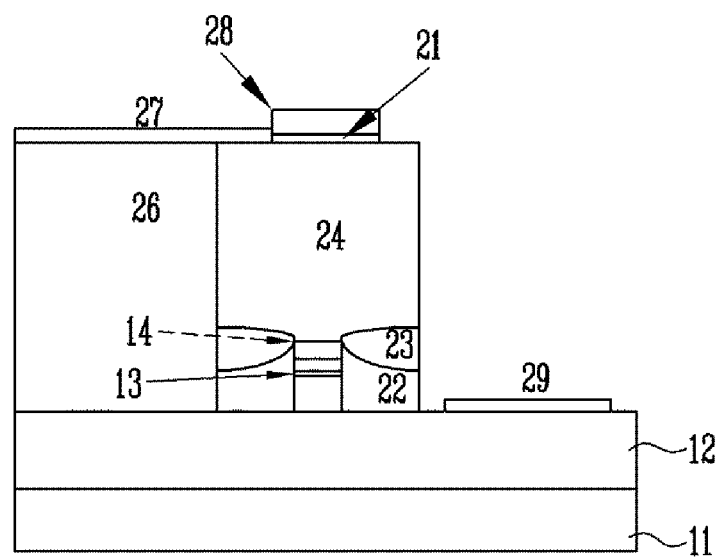
FIG. 4 is a conceptual view illustrating a cross-section of an active area of an SLD according to an embodiment of the present invention.

FIG. 4 is a conceptual view illustrating a cross-section of an active area of an SLD according to an embodiment of the present invention.

Referring to FIG. 4, the active area may be implemented to have a PBH structure as aforementioned. Furthermore, the remaining area of the active area besides the active area optical waveguide of a certain width including the multiple quantum well active layer 15 may be etched. Etching of the active area optical waveguide may be performed until the n-InP butter layer 12.

After performing etching and forming the active area optical waveguide, the RWG may be formed by laminating the current blocking layer 22, 23, clad layer 24 and ohmic layer 25. Etching may be performed such that an RWG of a certain width is formed on top of the active area optical waveguide.

The N-electrode 29 may be formed on top of the buffer layer 12 etched in order to generate the optical waveguide, and a p-electrode 29 may be formed on top of the ohmic layer 25. Furthermore, the polyimide 26 may be laminated on one side of the RWG, and an SiNx 27 thin film may be formed on top of the polyimide 26.

Figure 5:
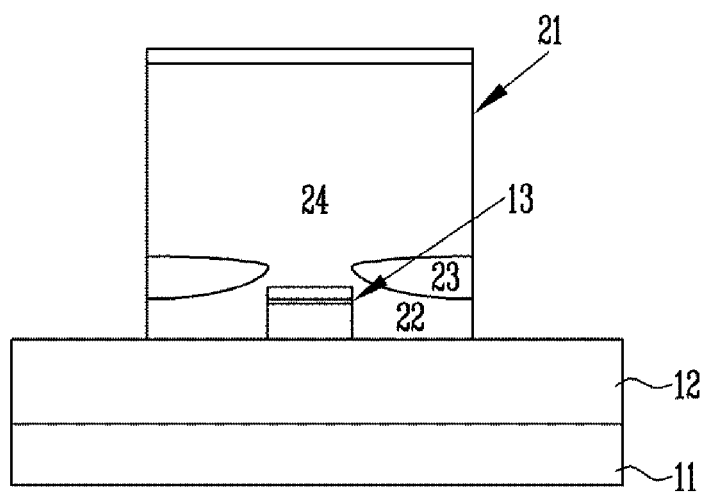
FIG. 5 is a conceptual view illustrating a cross-section of an SSC area according to an embodiment of the present invention.

FIG. 5 is a conceptual view illustrating a cross-section of an SSC area according to an embodiment of the present invention.

Referring to FIG. 5, an SSC area may be implemented to have a PBH structure as the active area. Besides the optical waveguide, the remaining SSC area may be etched. As aforementioned, the SSC area may be implemented by etching a portion of the laminated p-InP layer 16 and multiple quantum well active layer 15, and growing the InGaAsP waveguide layer 18 and p-InP layer 19 on top of the etched area, and then forming an SSC on top thereof. The area besides the area where the SSC is formed may be etched until the n-InP buffer layer 12.

After forming the SSC area optical waveguide and forming the current blocking layer 22, 23, a clad layer 24 and ohmic layer 25 are successively laminated to form an RWG. Etching may be performed such an RWG of a certain width is formed on top of the SSC area optical waveguide. A polyimide may not be laminated on the SSC area.

Figure 6:
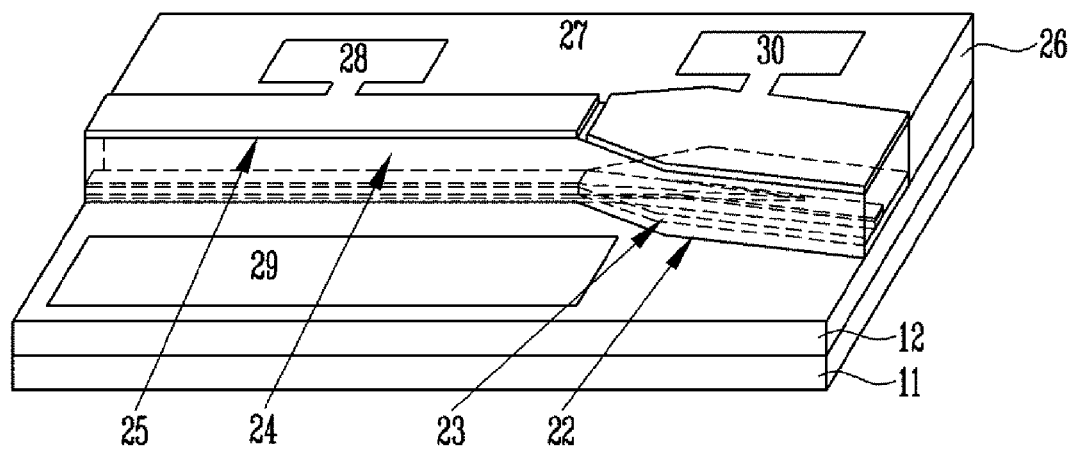
FIG. 6 is a conceptual view illustrating an SLD to which a phase control area has been added according to an embodiment of the present invention.

FIG. 6 is a conceptual view illustrating an SLD to which a phase control area has been added according to an embodiment of the present invention.

FIG. 6 discloses a method for dividing an SLD into two areas for fine refractive index change and using one area as an area for phase control.

Referring to FIG. 6, it is possible to implement a P-type electrode 30 of a phase control area that is an additional electrode on an SSC area, and implement an SLD such that the refractive index of an optical signal is adjusted by a current being injected into the P-type electrode 30 of the phase control area. That is, the SSC area of the SLD may be used as a phase control area. The phase control area may be located on a polymer waveguide area 51 of an external cavity laser that will be explained hereinbelow. However, in the case of forming a phase control area on the SLD, wavelength may be adjusted more easily. More specifically, the waveguide refractive index of the SLD is approximately 3.2, and such a waveguide refractive index of the SLD is or 2 times more than 1.3 that is the refractive index of the polymer waveguide. Therefore, when the phase control area is located on the SSC area, it is possible to make a greater change in the refractive index even when a less current is input, thereby easily adjusting the wavelength.

In the case of changing the structure of an active layer of an SLD 61 element, it may be applied to an R-SOA (reflective semiconductor optical amplifier) that is a ONU (optical network unit) light source of a re-modulation system of a WDM (Wavelength Division Multiplexing)-PON (passive optical network).

An SLD according to an embodiment of the present invention may be implemented in an SLD structure where an SSC of a buried deep ridge shape is integrated. Furthermore, the SLD may be implemented in a structure where a passive waveguide core is below the active layer and waveguide, a structure where a 2~9 μm of passive waveguide core is formed below the SSC, and a structure where polyimide and BCB (Benzocyclobutene) are formed on an exterior of the RWG in order to reduce the parasitic capacitance.

Figure 7:
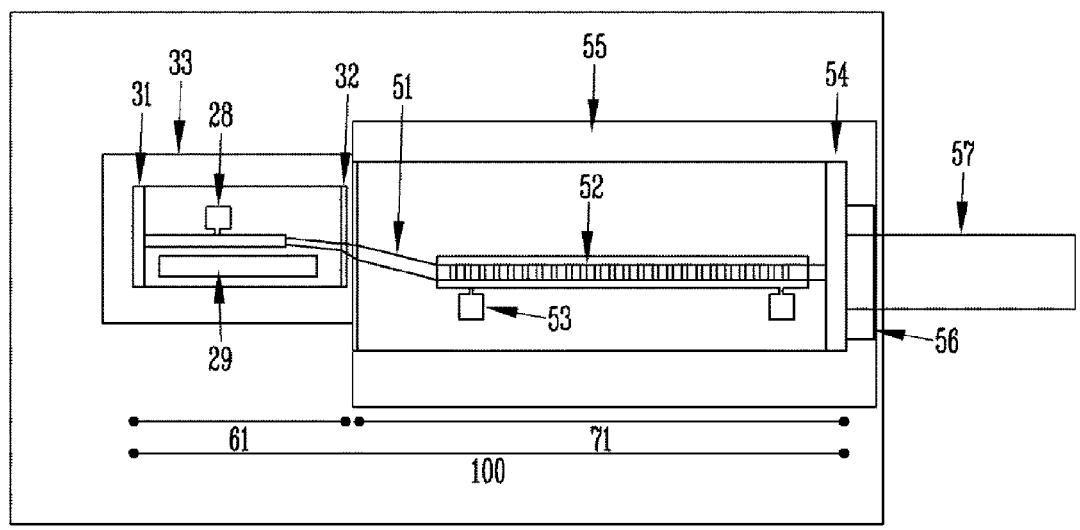
FIG. 7 is a conceptual view illustrating an external cavity laser which has its basis on an SLD according to an embodiment of the present invention.

FIG. 7 is a conceptual view illustrating an external cavity laser based on an SLD according to an embodiment of the present invention.

Referring to FIG. 7, an SLD part 61 and a polymer device part 71 may be integrated to form an external cavity laser 100.

The SLD part 61 may include a high reflective coating surface 31, non-reflective coating surface 32, and thermoelectric cooler (TEC) 33 of the SLD area.

The polymer device part 71 may include an RWG structure 51 of an active layer, a polymer grating area 52, an electrode 53 of the polymer grating area, a non-reflective coating layer 54, a thermoelectric cooler (TEC) 55 of the polymer grating area, an optical fiber fixed block 56, and an optical fiber 57.

A rear interface of the SLD part 61 that is a light source may be implemented by a high reflective coating surface 51, and a front interface may be implemented by a non-reflective coating surface 52. When a current is injected into the SLD part 61, an optical signal may be generated at the active area. After a high reflection occurs in the rear interface of the active area, the optical signal generated at the active area may be injected into a waveguide 51 of the polymer device part 71 through the front interface that has been non-reflective coated. The optical signal injected into the waveguide 51 of the polymer device may be transmitted to a bragg grating 52 formed on the polymer waveguide 51. Of the optical signals transmitted to the bragg grating 52, an optical signal corresponding to a wavelength of a reflection cycle of the bragg grating 52 may return to the active area of the SLD 61.

When an optical signal is or above a certain profit due to the resonant phenomenon between a high-reflective coating layer of the SLD and the bragg grating 52, resonating may occur. When transmitting and receiving of an optical signal between the active area and bragg grating 52 is repeated and the optical signal is or above a certain profit, resonating may occur. A resonated optical signal may be transmitted through an optical fiber 57. That is, an external cavity laser may be implemented as the SLD part 51 is high-reflective coated and then a certain portion of the bragg grating 52 formed on the polymer waveguide forms a cavity.

For temperature stabilization of the optical signal of the resonated wavelength, a thermoelectric cooler (TEC) 33 may be implemented on the SLD part 61. The polymer element part 71 may be attached on top of a silica sub mounter. An exit portion of the SLD part 61 may be formed to be tilted by about 7~15 degrees in order to reduce the reflection between it and the polymer element part 71. The polymer element may be formed to be tilted by about 25~45 in response to the tilt of the exit part of the SLD part 61.

The effective refractive index of the waveguide 51 of the polymer element part 71 may be 1.39, and the difference of the effective refractive index may be 0.019. The thermo-optic coefficient of the polymer is $2.636 \times 10^{-4}/°$ C. Polymer has a greater thermo-optic coefficient compared to other materials, and thus has a greater variability of the refractive index compared to injected power. Therefore, when a bragg grating is formed on the polymer waveguide 51, there are great changes in the reflection peak, and thus changing the wavelength may be possible. A thermoelectric cooler 55 may be attached for precise temperature control of the polymer element part 71. Furthermore, it is possible to reduce optical loss to the exterior of the polymer by implementing a non-reflective coating layer 54 on an end of the polymer element part 71.

Figure 8:
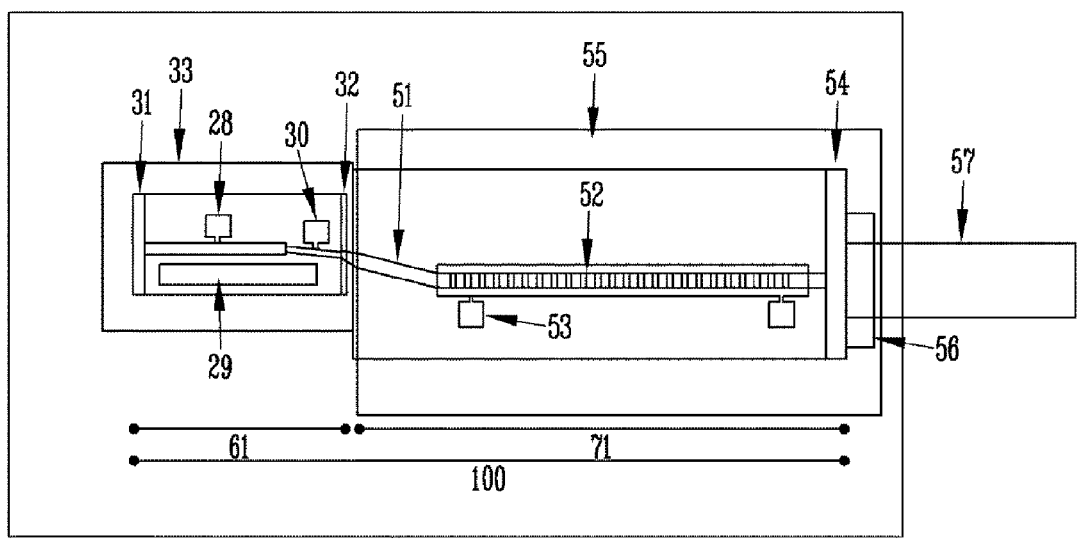
FIG. 8 is a conceptual view of an external cavity laser which has its basis on an SLD according to an embodiment of the present invention.

FIG. 8 is a conceptual view illustrating an external cavity laser that has its basis on an SLD according to an embodiment of the present invention.

In FIG. 8, an SLD to which a phase control area 30 has been added and an integrated external cavity laser 100 are disclosed. When a phase control area 30 is added, the SLD has a structure where a more precise power control is possible.

In the drawings and specification, there have been disclosed typical embodiments of the invention, and although specific terms are employed, they are used in a generic and descriptive sense only and not for purposes of limitation. As for the scope of the invention, it is to be set forth in the following claims. Therefore, it will be understood by those of ordinary skill in the art that various changes in form and details may be made therein without departing from the spirit and scope of the present invention as defined by the following claims.

What is claimed is:

1. A method for implementing an SLD (superluminescent diode) that is a light source of a wavelength tunable laser, the method comprising:
    growing a first epi layer on top of an SI (semi-insulating substrate);
    re-growing a butt layer based on the first epi layer;
    forming a tapered SSC (spot size converter) on the re-grown butt layer;
    forming an optical waveguide on an active area that is based on the first epi layer and on an SSC area that is based on the tapered SSC;
    forming an RWG (ridge waveguide) on the optical waveguide;
    forming a polyimide layer on one side of the RWG in the active area; and
    forming a p-type electrode and an n-type electrode.

2. The method according to claim 1, wherein the first epi layer is formed by successively laminating an n-InP buffer layer, InGaAsP passive waveguide layer, n-InP bottom clad layer, multiple quantum well active layer and p-InP top clad layer.

3. The method according to claim 2, wherein the re-growing a butt based on the first epi layer comprises:
    laminating an SiNx thin film on top of the p-InP top clad layer;
    etching the SiNx thin film, the p-InP top clad layer and the multiple quantum well active layer;
    forming an InGaAsP waveguide layer on the etched area; and
    forming an p-InP layer on the InGaAsP waveguide layer.

4. The method according to claim 3,
    wherein the forming a tapered SSC on the re-grown butt layer comprises:
    etching a portion of the InGaAsP waveguide layer and the p-InP layer; and
    forming the tapered SSC on top of the p-InP layer.

5. The method according to claim 4,
    wherein the forming an optical waveguide based on the first epi layer and the SSC comprises etching a portion of the active area and the SSC area including the unetched SiNx thin film layer, the p-InP top clad layer, and the multiple quantum well active layer until the n-InP buffer layer.

6. The method according to claim 5,
    wherein the forming an RWG on the optical waveguide comprises:
    laminating a current blocking layer on a right and left of the optical waveguide;
    laminating a clad layer on top of the optical waveguide and the current blocking layer;
    laminating an ohmic layer on top of the clad layer; and
    selectively etching the current blocking layer, the clad layer and the ohmic layer.

7. The method according to claim 6,
    wherein the active area and the SSC area are implemented in a PBH (planar buried heterostructure) structure.

8. The method according to claim 7,
    wherein the SSC area is implemented to curve by 5 to 15 degrees.

9. The method according to claim 1,
    wherein the RWG is implemented to have a width of 9 to 11 µm.

10. The method according to claim 1,
    further comprising implementing a p-type electrode of a phase control area that is an additional electrode on the SSC area in order to adjust a refractive index of an optical signal.

11. The SLD according to claim 1, wherein the polyimide layer comes in contact with the one side of the RWG in the active area.

12. The SLD according to claim 1, wherein the first epi layer is formed by successively laminating an n-InP buffer layer, InGaAsP passive waveguide layer, n-InP bottom clad layer, multiple quantum well active layer and p-InP top clad layer, and
    before the re-growing of the butt layer, the multiple quantum well active layer and the p-InP top clad layer are etched, such that the multiple quantum well active layer and the p-InP top clad layer formed outside the active area are completely removed.

13. A method for implementing an SLD (superluminescent diode) that is a light source of a wavelength tunable laser, the method comprising:
    growing a first epi layer on top of an SI (semi-insulating substrate);
    re-growing a butt layer based on the first epi layer;
    forming a tapered SSC (spot size converter) on the re-grown butt layer;
    forming an optical waveguide on an active area that is based on the first epi layer and on an SSC area that is based on the tapered SSC;
    forming an RWG (ridge waveguide) on the optical waveguide; and
    forming a p-type electrode and an n-type electrode,
    wherein the forming an RWG on the optical waveguide comprises:
    laminating a current blocking layer on a right and a left of the optical waveguide;
    laminating a clad layer on top of the optical waveguide and the current blocking layer; and etching the current blocking layer and the clad layer such that the current blocking layer and the clad layer remain only in a region on which the RWG is formed.

14. The SLD according to claim 13, wherein the first epi layer is formed by successively laminating an n-InP buffer layer, InGaAsP passive waveguide layer, n-InP bottom clad layer, multiple quantum well active layer and p-InP top clad layer, and before the re-growing of the butt layer, the multiple quantum well active layer and the p-InP top clad layer are etched, such that the multiple quantum well active layer and the p-InP top clad layer formed outside the active area are completely removed.

* * * * *